(12) United States Patent
Hinterscher

(10) Patent No.: US 6,734,711 B1
(45) Date of Patent: May 11, 2004

(54) SLOW INPUT TRANSITION STABILIZER CIRCUIT

(75) Inventor: Eugene B. Hinterscher, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/404,267

(22) Filed: Apr. 1, 2003

(51) Int. Cl.[7] .............................. H03K 5/08; H03L 5/00
(52) U.S. Cl. ...................... 327/309; 327/310; 365/111
(58) Field of Search ............................. 327/309, 310, 327/318, 319, 327, 328; 326/26, 27, 31, 34; 361/56, 111

(56) References Cited

U.S. PATENT DOCUMENTS 6,628,139 B2 * 9/2003 Porter et al. ................... 326/26
RE38,319 E * 11/2003 Lin et al. ...................... 327/313

* cited by examiner

Primary Examiner—Tuan T. Lam
(74) Attorney, Agent, or Firm—J. Dennis Moore; W. James Brady III; Frederick J. Telecky, Jr.

(57) ABSTRACT

An input transition stabilizer circuit, adapted to stabilize an input transition of a signal appearing at the input of an input circuit, the input transition stabilizer circuit includes a resistor having a first terminal connected to the input of the input circuit;, and a capacitor. A first MOS device is connected by a source and a drain between a second terminal of the resistor and a first terminal of the capacitor, while a second MOS device is connected by a source and a drain between a second terminal of the capacitor and ground. A delay circuit is adapted to provide a signal to a gate of the first MOS device and a gate of the second MOS device corresponding to a signal at the input of the input circuit, but delayed by a first predetermined interval. In some embodiments the delay circuit is provided in two parts, with the signal provided to the first MOS device being delayed by a further amount, as compared with the signal provided to the second MOS device.

5 Claims, 1 Drawing Sheet

SLOW INPUT TRANSITION STABILIZER CIRCUIT

TECHNICAL FIELD OF THE INVENTION

This invention relates to electronic circuits, and more particularly relates to an improved input transition stabilizer circuit.

BACKGROUND OF THE INVENTION

Integrated circuit technology allows the fabrication of integrated circuit "chips" including thousands of devices. In this way, very complex circuits can be implemented in packages having a very small size. However, placing many devices in a small area can give rise to problems. One problem that sometimes occurs is the presence of "glitches," or unintended reversals of logic state at the inputs to such integrated circuits, leading to erroneous results at the outputs of the circuits. Such glitches can occur as a result of the large signal swing at an output of the circuit coupling to either or both of the voltage supply, $V_{CC}$, and the circuit ground, through, for example, package parasitic reactance. The resulting swing in the voltage of $V_{CC}$ and/or ground is sometimes called "$V_{CC}$ bounce" or "ground bounce," respectively. When this voltage bounce appears at the $V_{CC}$ and/or ground of an input circuit, such as an input buffer, a glitch can occur, for example as the input buffer is pinched off during an input signal transition. This is especially true for circuits receiving an input having a slow input transition, or "ramp rate."

FIG. 1 is a diagram showing a simplified circuit 100, illustrating ground bounce. The circuit has a pair of input terminals 101, the non-ground terminal of which is connected to one terminal of an electrostatic discharge (ESD) resistor 102. The other terminal of resistor 102 is connected to the input of an inverting input buffer 103. The output of the inverting input buffer 103 is connected to other circuitry (not shown), the output of which is connected to the input of an output buffer 104. The output of output buffer 104 is connected to the non-ground terminal of a pair of output terminals 105. As shown, a voltage swing on the ground terminal of output terminal 105 can couple back 106 to the ground of the input buffer 103, resulting in an unwanted glitch, as described above.

To alleviate this problem, a dynamic hysteresis circuit "DHC" is sometimes used. FIG. 2 is a diagram showing a simplified circuit 200, like circuit 100 of FIG. 1, but also including a DHC 107. As can be seen, DHC 107 is connected between the output of input buffer 103 and ground. The DHC 107 operates to activate a "holding transistor" when the output of input buffer 103 initially switches. This holding transistor holds the node in the new state if the input buffer 103 is disturbed and momentarily starts to switch back to the previous state, i.e., outputs a glitch. The DHC 107 also has a delay portion through which the signal propagates. After a signal propagates through the delay portion of the DHC 107, the DHC 107 is turned off.

The DHC solution is effective to prevent glitches from propagating to the output of a circuit. However, it can add an undesirable propagation delay to the overall circuit. In addition, a DHC can be sensitive to power supply current ($I_{CC}$) versus frequency tests, and if not properly designed can cause the overall circuit to malfunction at certain frequencies. The DHC is connected to the output of the input buffer; if the frequency of operation of the overall circuit is fast enough that the input signal switches again, as part of its normal operation, before the DHC times out, the holding transistor of the DHC can remain active and affect the speed of the node to which it is connected.

It would therefore be desirable to have a solution to the problem of glitches, while overcoming the problems of the prior art.

SUMMARY OF THE INVENTION

In accordance with the present invention, there is provided an input transition stabilizer circuit, adapted to stabilize an input transition of a signal appearing at the input of an input circuit, the input transition stabilizer circuit includes a resistor having a first terminal connected to the input of the input circuit;, and a capacitor. A first MOS device is connected by a source and a drain between a second terminal of the resistor and a first terminal of the capacitor, while a second MOS device is connected by a source and a drain between a second terminal of the capacitor and ground. A delay circuit is adapted to provide a signal to a gate of the first MOS device and a gate of the second MOS device corresponding to a signal at the input of the input circuit, but delayed by a first predetermined interval. In some embodiments the delay circuit is provided in two parts, with the signal provided to the first MOS device being delayed by a further amount, as compared with the signal provided to the second MOS device.

These and other features of the invention will be apparent to those skilled in the art from the following detailed description of the invention, taken together with the accompanying drawings.

DETAILED DESCRIPTION OF THE PREFERRED EMBODIMENT

The numerous innovative teachings of the present invention will be described with particular reference to the presently preferred exemplary embodiments. However, it should be understood that this class of embodiments provides only a few examples of the many advantageous uses and innovative teachings herein. In general, statements made in the specification of the present application do not necessarily delimit the invention, as set forth in different aspects in the various claims appended hereto. Moreover, some statements may apply to some inventive aspects, but not to others.

Figure 3:
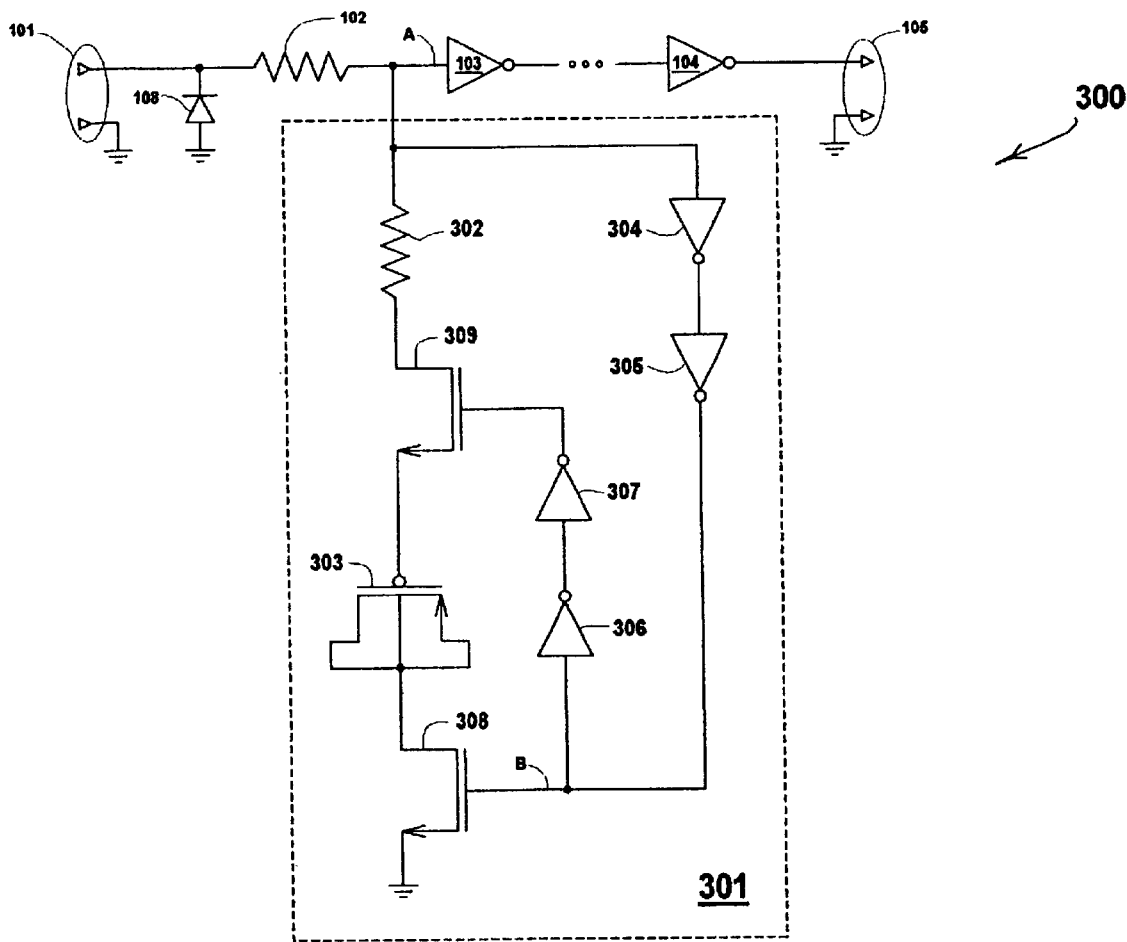
FIG. 3 is a circuit diagram illustrating a preferred embodiment of the present invention.
Figure 2:
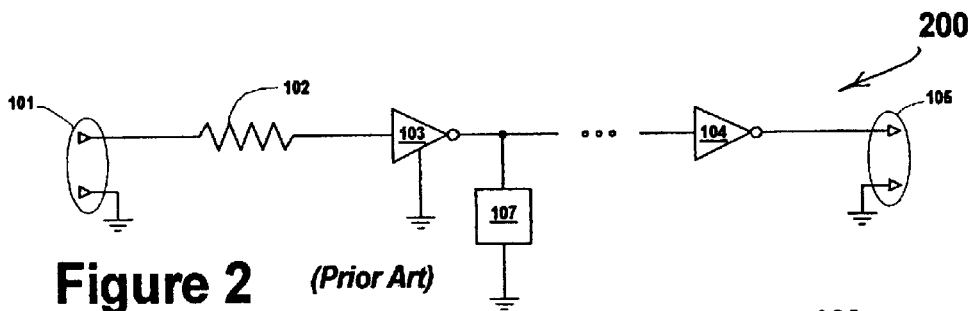
FIG. 2 is a circuit diagram illustrating a prior art dynamic hysteresis circuit.
Figure 1:
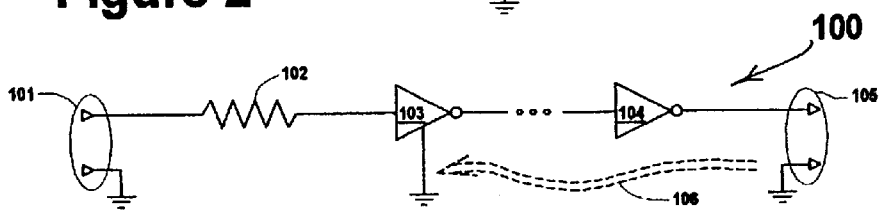
FIG. 1 is a circuit diagram illustrating ground bounce.

FIG. 3 is a diagram showing a circuit 300 including an input transition stabilizer circuit 301 according to a preferred embodiment of the present invention. Other components in circuit 300 having the same reference numbers as in FIG. 1 are the same as in that figure. As in circuit 100, the circuit 300 includes a pair of input terminals 101, the non-ground terminal of which is connected to one terminal of an electrostatic discharge (ESD) resistor 102, with the other terminal of resistor 102 being connected to the input of an input buffer 103. The output of the input buffer 103 is likewise connected to other circuitry (not shown), the output of which is connected to the input of an output buffer 104, with the output of output buffer 104 being connected to the non-ground terminal of a pair of output terminals 105.

However, circuit 300 includes stabilizer circuit 301 connected between node A, the input of input buffer 103, and ground. The stabilizer circuit 301 uses a resistor 302 and a capacitor 303 to provide an assist for input termination during a relatively slow input transition, while having little effect on propagation delays and input capacitance. Capacitor 303 is formed from a P-channel metal oxide semiconductor (MOS) device, by connecting its source, drain and backgate terminals together. Inverters 304, 305, 306 and 307 are used to connect and disconnect resistor 302 and capacitor 303 in series from the input of input buffer 103 to ground. As an input signal appearing at node A makes a transition from low-to-high level, the inverters 304, 305, 306 and 307 operate to connect the series connected resistor 302 and capacitor 303 to ground by switching N-channel MOS devices 308 and 309 on before the output of the inverting input buffer 103 switches to a low state. Conversely, as an input signal appearing at node A makes a transition from high-to-low level, the inverters 304, 305, 306 and 307 operate to disconnect the series connected resistor 302 and capacitor 303 from ground by switching devices 308 and 309 off after the output of the inverting input buffer 103 switches to a high state.

Note that in the embodiment shown in FIG. 3, two delay branches are provided. A first branch, implemented by inverters 304 and 305, initially provides a signal transition, delayed from node A, to node B, which is connected to the gate of device 308 to either turn it on or off, depending upon the direction of input transition of the signal at node A. A second branch, implemented by inverters 306 and 307, provides a signal transition, delayed from node B, to the gate of device 309 to either turn it on or off, likewise depending upon the direction of input transition of the signal at node A. This ensures that the capacitor 303 is connected to ground before resistor 302 is connected to capacitor 303. In this way, capacitor 303 is connected to ground and waiting for resistor 302 to complete the input termination. N-channel device 308 isolates capacitor 303 from ground when the input is low. N-channel device 309 isolates resistor 302 from capacitor 303 when the input is low, and prevents the capacitance of capacitor 303 from having an effect on node A through resistor 302.

Thus, series connected resistor 302 and capacitor 303 help with input termination during a relatively slow transition of an input signal by ensuring that the series combination is connected to node A before the input buffer 103 can switch for a low-to-high transition, i.e., output high-to-low, and after it can switch for a high-to-low transition, i.e., output low-to-high. The input capacitance at the input terminal of a device is generally measured with the input voltage at either $V_{CC}$ or ground. In most cases, the input capacitance is lower when the input voltage is tested at $V_{CC}$ level, because the large diode 108 in the primary ESD clamp is reverse biased. Since devices 308 and 309 are in the on state when the input capacitance is measured at the $V_{CC}$ level, capacitor 303 does contribute to the overall input capacitance of circuit 300. However, capacitor 303 is preferably designed to have a capacitance that is significantly smaller than the capacitance of the large diode in the primary ESD clamp. For example, a typical capacitance for such a large diode might be 0.5 pF. In such a circuit capacitor 303 would be designed to have a capacitance in the range of 0.4 pF, for example. It should be understood, however, that these capacitance values and ranges are merely exemplary, and the invention is not limited to such values and ranges.

On the other hand, since devices 308 and 309 are in the off state when the input capacitance is measured at the ground level, capacitor 303 is disconnected from node A, and therefore does not contribute to the overall input capacitance of circuit 300. The other components in stabilizer circuit 301 contribute little to the overall input capacitance of circuit 300.

Additionally, note that an input, for example inverting input buffer 103, is a receiver in a circuit board environment. In such an environment, drivers drive receivers through small connections that behave like transmission lines. Thus, a driver sends signals through a transmission line to a receiver, and the receiver receives a signal that can have overshoot and undershoots, thereby adversely affecting signal integrity. Embodiments of the present invention, for example the embodiment shown in FIG. 3, can improve signal integrity, by improving the input termination.

Although the present invention and its advantages have been described in detail, it should be understood that various changes, substitutions and alterations can be made herein without departing from the spirit and scope of the invention as defined by the appended claims.

What is claimed is:

1. An input transition stabilizer circuit, for stabilizing an input transition of a signal appearing at the input of an input circuit, the input transition stabilizer circuit comprising
   a resistor having a first terminal connected to the input of the input circuit;
   a capacitor;
   a first MOS device connected by a source and a drain between a second terminal of the resistor and a first terminal of the capacitor;
   a second MOS device connected by a source and a drain between a second terminal of the capacitor and ground; and
   a delay circuit for providing a signal to a gate of the first MOS device and a gate of the second MOS device corresponding to a signal at the input of the input circuit, but delayed by a first predetermined interval.

2. An input transition stabilizer circuit as in claim 1, wherein the delay circuit comprises a series connected pair of inverters.

3. An input transition stabilizer circuit as in claim 1, wherein the delay circuit is further to provide a signal to the gate of the first MOS device corresponding to a signal at the input of the input circuit, but delayed by a second predetermined interval longer than the first predetermined interval.

4. An input transition stabilizer circuit as in claim 3, wherein the delay circuit comprises:
   a first delay circuit branch connected between the input to the input circuit and the gate of the second MOS device; and
   a second delay circuit branch connected between the gate of the second MOS device and the gate of the first MOS device.

5. An input transition stabilizer circuit as in claim 4, wherein the first delay circuit branch and the second delay circuit branch each comprise a series connected pair of inverters.

* * * * *